United States Patent [19]

Isobe

[11] 4,146,843

[45] Mar. 27, 1979

[54] PHASE SYNCHRONIZING ARRANGEMENT FOR VIDEO SYNCHRONOUS DETECTION

[75] Inventor: Mitsuo Isobe, Moriguchi, Japan

[73] Assignee: Matsushita Electric Industrial Co., Ltd., Osaka, Japan

[21] Appl. No.: 847,539

[22] Filed: Nov. 1, 1977

[30] Foreign Application Priority Data

Nov. 5, 1976 [JP] Japan .................. 51-133385

[51] Int. Cl.² .................. H03B 3/04; H03D 3/18; H04N 9/50
[52] U.S. Cl. .................. 329/50; 325/419; 329/122; 331/4; 331/23; 358/25; 358/195
[58] Field of Search .................. 329/50, 150, 154, 122, 329/124; 331/4, 23; 325/419–423; 358/25, 195

[56] References Cited

U.S. PATENT DOCUMENTS

| | | | |
|---|---|---|---|
| 2,794,910 | 6/1957 | Arends | 325/421 X |
| 3,461,388 | 8/1969 | Daley | 325/421 |
| 3,760,094 | 9/1973 | Skerlos | 358/23 X |

OTHER PUBLICATIONS

Hamade, "Phase-Lock Television IF Amplifier-Video Detector," IEEE Transactions on Consumer Electronics, vol. CE-21, Nov. 1975, pp. 340–347.

Primary Examiner—Siegfried H. Grimm
Attorney, Agent, or Firm—Stevens, Davis, Miller & Mosher

[57] ABSTRACT

An RF-IF signal receiving circuit of a television receiver controls a tuner which receives an amplitude modulated RF signal and converts it to an IF signal and an IF signal carrier generator for demodulating the amplitude modulated signal from the IF signal by synchronous detection, using a phase synchronous loop. A sweep voltage generator of a voltage-controlled oscillator in the phase synchronous loop comprises an envelope detector which is DC-coupled to an output of an amplitude synchronous detector and a low pass filter in order to enhance the pull-in range of the phase synchronous loop.

16 Claims, 11 Drawing Figures

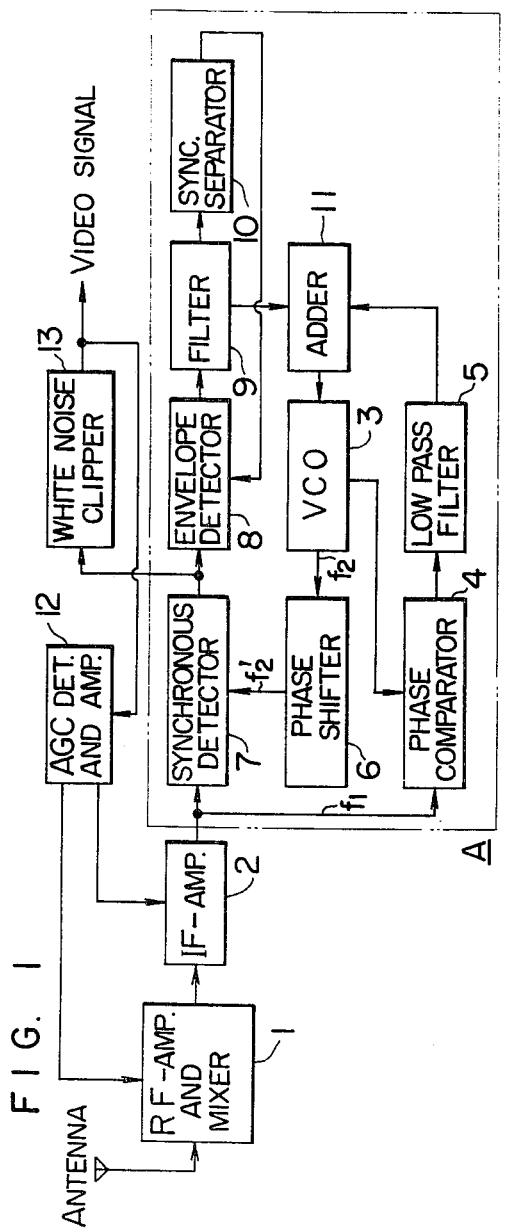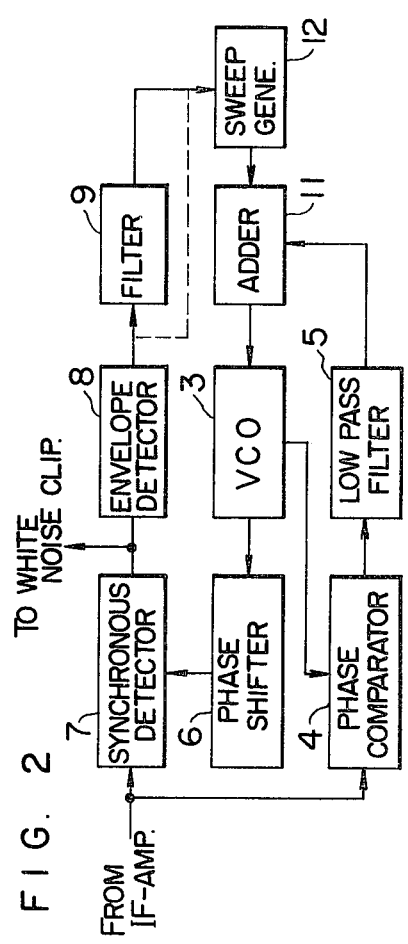

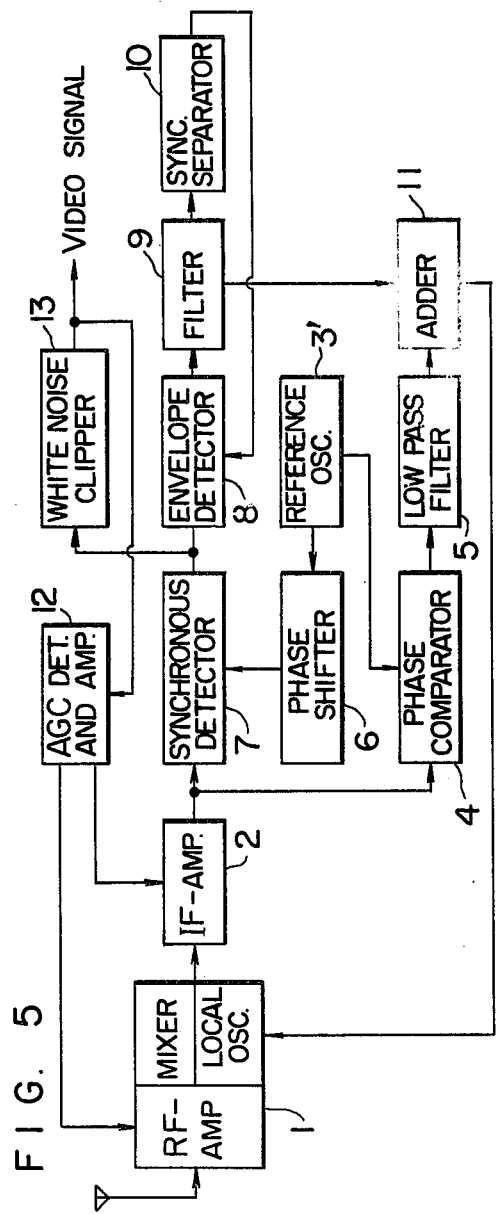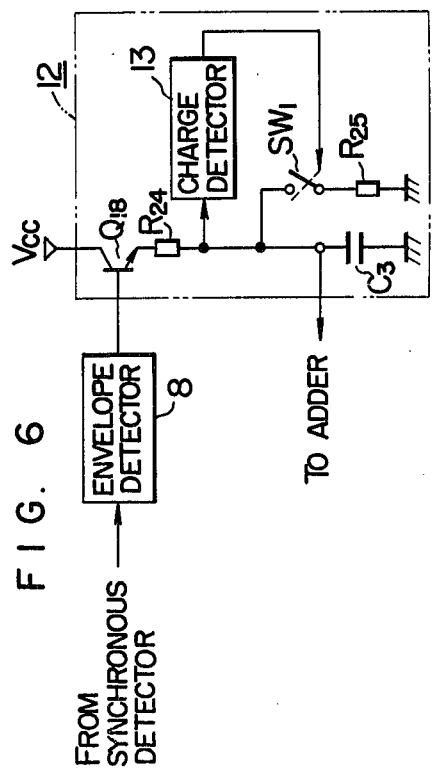

PHASE SYNCHRONIZING ARRANGEMENT FOR VIDEO SYNCHRONOUS DETECTION

The present invention generally relates to an arrangement of a demodulator using a phase-locked loop, and more particularly to an arrangement of a phase-locked loop for expanding a pull-in range to make it suitable for use in a color television receiver.

As is well known, in a conventional television receiver, a video demodulation circuit for demodulating a composite video signal is arranged in a final stage of a video IF amplifier circuit, and an intercarrier audio IF signal (4.5 MHz beat signal) is derived from a preceding stage or a succeeding stage of the video demodulation circuit. A synchronous detection method, as shown in U.S. Pat. No. 3,760,094 issued to Peter C. Skerlos on Sept. 18, 1973 which includes less nonlinear distortion in a detection stage than an envelope detection method using a diode, and which is free from quadrature distortion due to a vestigial side-band transmission, comprises a phase-locked loop including a reference oscillator which operates at a frequency of the video IF signal carrier, a phase comparator which receives the output of the reference oscillator and the video IF signal carrier, a low pass filter arranged at the output of the phase comparator and a voltage-controlled local oscillator. In the color television receiver in which the phase-locked loop effectively provides an automatic fine tuning function as described above there is required a pull-in range in the order of ±1 MHz for the phase-locked loop.

In such a phase-locked loop, when it is desired to expand the pull-in range thereof, it has been a common practice to establish a large loop gain and broaden a pass band of the low pass filter. However, this approach is not desirable because it sacrifices stability of the phase-locked loop to noise.

Another approach to expand the pull-in range has been proposed, in which the voltage-controlled oscillator is forcibly swept to take synchronization in the course of the sweep, as shown in the Japanese Laid-Open Patent No. 51-57275 laid-open on May 19, 1976. In this method, by making use of the fact that the output signal of the phase comparator in the phase-locked loop is in the form of a beat under non-phase-synchronized condition, an absolute magnitude of the frequency components of the beat signal is detected and the voltage-controlled oscillator is forcibly swept at a rate proportional to the detected absolute magnitude to make phase synchronization with an input signal in the course of the sweep. Since this system detects the phase synchronized condition by detecting the beat signal in the output of the phase comparator, only the beat component can be detected when the circuit is AC-coupled through a capacitor, but when the circuit is DC-coupled, the beat component cannot be discriminated from the DC level variation of the output of the phase comparator and hence it is very difficult to determine synchronized and non-synchronized conditions. More particularly, since the phase comparator is usually designed to produce the output signal the DC level of which widely changes between a low level and a high level in order to widen the linear operation range of the phase-locked loop to widen the pull-in range and also the hold-in range, the change of the output due to the non-phase-synchronized beat signal in the output of the phase comparator occurs only within the range of variation of the output DC level permitted to hold the phase synchronized condition, and hence it is difficult to discriminate the beat signal. This is one of factors to block the implementation of the system in an integrated circuit structure.

It is, therefore, an object of the present invention to provide a synchronous demodulator using a phase-locked loop having a wide pull-in range.

It is another object of the present invention to provide a phase synchronized condition detector which is suited for use in an integrated circuit structure.

The present invention is directed to an arrangement of a synchronous demodulator which receives an amplitude modulated RF signal like a television receiver and demodulates the modulated signal by a phase-locked loop. The present arrangement includes a phase comparator which detects a phase relation between an IF signal from a tuner and an output of an IF carrier generator to produce an error signal and continuously supplies a control signal to a voltage-controlled oscillator (VCO), a video synchronous detector for detecting the IF signal with said IF carrier signal to produce a video signal, and an envelope detector which is DC-coupled to an output terminal of the video synchronous detector, a detection polarity of the envelope detector being different from an effective demodulation polarity of the video synchronous detector. The output of the envelope detector is coupled to the voltage-controlled oscillator, which, in turn, is adapted to be controlled by the output signal of the phase comparator and a sweep voltage which is produced using an output generated from the envelope detector only when the phase-locked loop is not in synchronism.

According to one aspect of the present invention, there is provided a phase synchronizing arrangement for a television receiver including a tuner having a local signal oscillator and a mixer for receiving a radio frequency carrier signal modulated with a video signal and an audio signal to convert it to an intermediate frequency carrier signal, an intermediate frequency (IF) amplifier stage for amplifying an output signal from the tuner, an automatic gain control (AGC) circuit for producing gain control signal to be applied to the tuner and the IF amplifier stage, and a phase synchronizing circuit having an IF carrier generator for generating a video IF carrier signal for video synchronous detection, the phase synchronizing circuit comprising, first phase-locked loop (PLL) means comprising a phase comparison means for producing an error signal which is proportional to a phase difference between said converted intermediate frequency carrier signal and an output signal from the IF carrier generator and a voltage-controlled oscillator functioning as the IF carrier generator or the local signal oscillator and responsive to the error signal from the phase comparison means for controlling said converted intermediate frequency carrier signal in a predetermined phase relation with the IF carrier signal from the IF carrier generator, second phase-locked loop means comprising a video synchronous detection means for detecting the converted intermediate frequency carrier signal using an output of the IF carrier generator to derive a video signal therefrom, an envelope detection means having an input DC-coupled to an output terminal of the video synchronous detection means for detecting an output signal thereof when the first phase-locked loop means is in non-phase-synchronized condition and a sweep signal means responsive to the output signal detected by the envelope detection means for producing a sweep signal, and the voltage-controlled oscillator controlled by the sweep signal from the sweep signal means, and combining means coupled to the phase comparison means and the sweep signal means for combining the error signal and the sweep signal to supply its output to the voltage-controlled oscillator.

The above and other objects, features and advantages of the present invention will be apparent from the following description of the preferred embodiments of the invention when taken in conjunction with the accompanying drawings, in which:

FIG. 1 is a block diagram showing an arrangement of receiving and detecting stages of a television receiver to which the present invention has been applied;

FIG. 2 is a block diagram of a detecting stage illustrating another arrangement of the present invention;

Figure 4A:
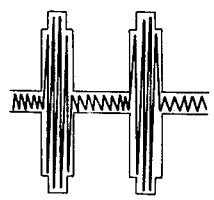
Figure 4A:
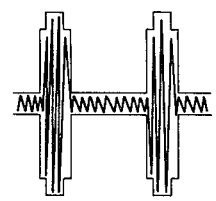

FIGS. 4A, 4A', 4B, 4B', 4C and 4C' show signal waveforms used to explain the present invention;

FIG. 5 is a block diagram showing another arrangement of receiving and detecting stages of the television receiver embodying the present invention; and FIG. 6 shows a detailed diagram of the circuit shown by a broken line in FIG. 2.

Referring to FIG. 1, receiving and demodulating stages of a color television receiver having a phase-locked loop in accordance with the present invention are explained. A tuner 1 having an RF amplifier stage and a mixer and a video IF amplifier stage 2 are arranged in a manner as in a conventional television receiver. The IF amplifier stage 2 includes a filter circuit adapted to receive a vestigial side-band signal to provide a high quality reproduced picture image and has a trapping characteristic to the video and audio carriers of adjacent channels. The video synchronous demodulator section A comprises a phase-locked loop including a voltage-controlled oscillator (VCO) 3, a phase comparator 4 and a low-pass filter 5, a phase shift circuit 6 for providing phase change of $\pi/2$ (rad) or $-\pi/2$ (rad) (hereinafter merely referred to as $\pi/2$ (rad)) to the output signal $f_2$ from the voltage-controlled oscillator 3, a synchronous detector stage 7 to which the output signal $f_2'$ of the phase shift circuit 6 and the output signal of the IF amplifier stage 2 are applied, a detector 8 connected to the output of the synchronous detector stage 7, a filter 9, a synchronous signal separator 10 and an adder 11. An automatic gain control signal generator 12 receives the video signal and produces a D.C. voltage to control the tuner 1 and the IF amplifier stage 2 and coupled thereto. The video signal is derived from a white noise clipper 13 connected to the output of the synchronous detector stage 7.

The operation of the video synchronous demodulation section A of the present invention is now explained in detail. The amplitude modulated IF signal applied to the phase comparator 4 and the synchronous detector stage 7 includes a video carrier component at 45.75 MHz and an audio carrier component at 41.25 MHz. Since the free-running frequency of the voltage-controlled oscillator 3 is set at 45.75 MHz, the phase comparator 4 produces a signal (a D.C. voltage or a beat signal) which is proportional to a phase difference or a frequency difference between the two input signals, which signal is fed back to the VCO 3 through the low-pass filter 5 and the adder 11. Assuming that the phase-locked loop is initially in non-phase-synchronized condition, the phase comparator 4 produces a beat signal from the frequency of the video carrier of the IF amplifier stage 2 and the VCO 3. If the frequency of the beat signal is low enough to lie within the pass band of the low-pass filter 5, the oscillation frequency of the VCO 3 is changed through the adder 11. However, if the frequency of the beat signal is high, the output of the low-pass filter 5 does not produce the beat component so that the VCO 3 maintains the oscillation at the free-running frequency. In this case, on the other hand, a beat signal an envelope of which includes relatively low frequency components of the video signal is produced at the output of the synchronous detector stage 7. The AGC of peak value type is preferable to obtain such a signal. The detector 8 is designed to have a detection polarity which is different from the polarity of the synchronous detector stage 7, and the filter 9 connected to the output of the detector 8 is designed to have such a time constant that an integrated waveform of the envelope of the beat signal is substantially a sawtooth wave at the vertical scanning frequency. The output of the filter 9 is combined with the control voltage to the VCO 3 in the phase-locked loop by the adder 11. A synchronous signal separator circuit 10 connected to another output of the low-pass filter 9 feeds back the output signal thereof to the detector 8 to operate the detector 8 only during the vertical synchronizing signal period so that the output signal of the low-pass filter 9 applied to the adder 11 has a desired amplitude even when a mean luminance level of the video signal is relatively low.

In the circuit arrangement described above, when the phase synchronized condition of the phase-locked loop is not maintained, the VCO 3 is controlled by substantially two phase control loops, that is, the first phase-locked loop including the phase comparator 4, the low-pass filter 5 and the VCO 3, and the second phase-locked loop including the phase shift circuit 6, the synchronous detector 7, the detector 8 forming the sweep voltage generator section, the low pass filter 9, the synchronous separator circuit 10 and the VCO 3. The second phase-locked loop functions to forcibly sweep the oscillation frequency of the VCO 3 by the sweep voltage at the output of the low-pass filter 9 under the out-of-phase synchronization condition. Because of this forced sweep, when the output frequency of the VCO 3 enters the pull-in range of the first phase-locked loop, the first and second phase-locked loops go into the phase synchronized condition.

Under the phase synchronized condition thus obtained, no beat component is included in the output of the phase comparator 4 and only the DC component corresponding to the phase difference between the input signals $f_1$ and $f_2$ is produced at this output. The synchronous detector 7 no longer constitutes a phase-locked loop but substantially functions as a mere synchronous detector.

In this manner, even when the oscillation frequency of the VCO 3 is beyond the pull-in range of the first phase-locked loop, the oscillation frequency can be brought into the pull-in range of the first phase-locked loop by sweeping the oscillation frequency by the second phase-locked loop so that the phase synchronization is attained when the oscillation frequency enters the pull-in range. Thus, the pull-in range can be substantially expanded to a great extent.

The white noise clipper 13 eliminates noise components expanding beyond a white peak level of the luminance signal which are created by the synchronous detection.

FIG. 2 shows another arrangement of the video synchronous demodulator section A in accordance with the present invention in which a low frequency oscillator 12 as the sweep voltage generator circuit is arranged between the filter 9 and the adder 11. The oscillator 12 is shown as being controlled by the output signal of the filter 9, but it may be controlled by the output of the detector 8 as shown by a broken line. When the oscillator 12 is controlled by a filtered or smoothed DC voltage, the charge/discharge time constant of the filter 9 is preferably short in order that the sweep circuit 12 provides a fast response.

Figure 3:
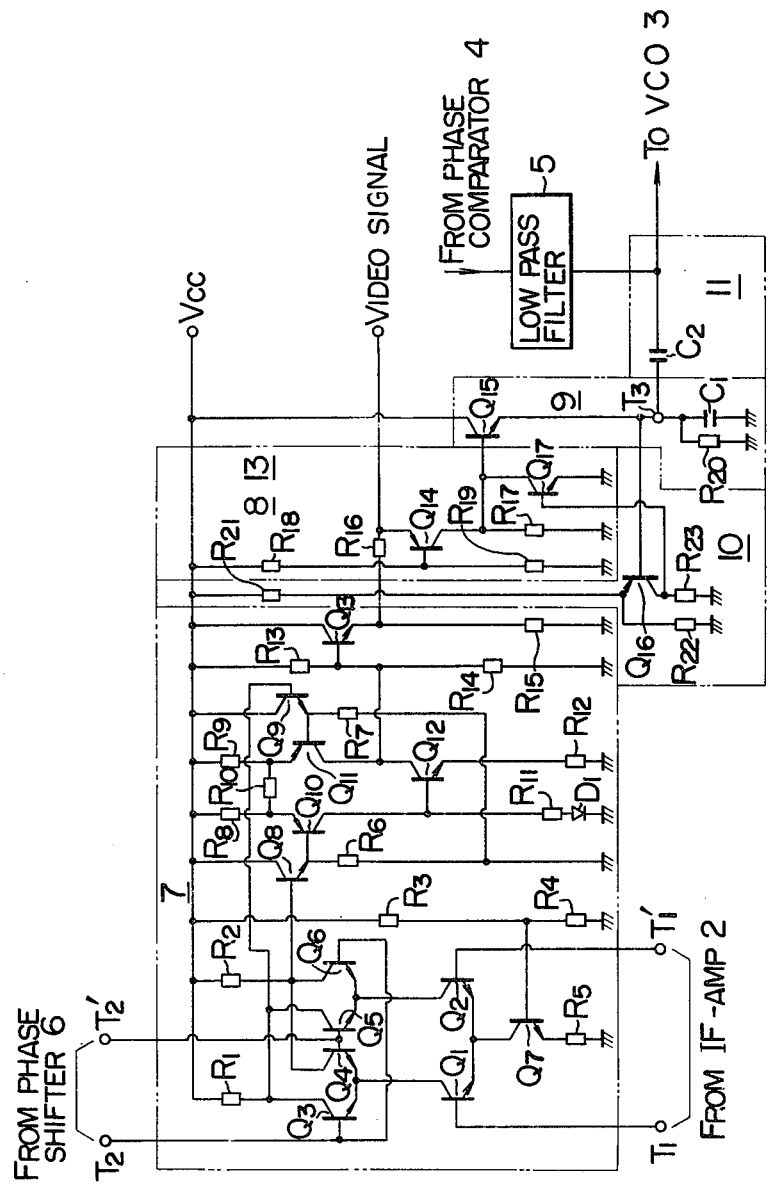
FIG. 3 is a detailed circuit diagram of a portion of FIG. 1.
Figure 4B:
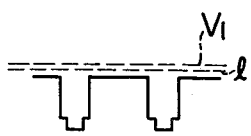
Figure 4B:
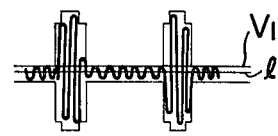
Figure 4C:
Figure 4C:
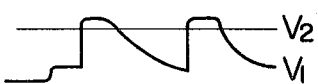

FIG. 3 shows the detail of a portion of the arrangement shown in FIG. 1. The synchronous detector 7 comprises a doubly-balanced differential amplifier having transistors $Q_1$ to $Q_7$ and resistors $R_1$ to $R_5$, and the output signal of the synchronous detector 7 is applied to bases of transistors $Q_{10}$ and $Q_{11}$ forming a differential amplifier through transistors $Q_8$ and $Q_9$ forming buffer amplifiers. A load circuit of the differential amplifier includes a current Miller circuit comprising a transistor $Q_{12}$ and a diode $D_1$ and also includes load resistors $R_{13}$ and $R_{14}$. When the video IF signal (shown in FIG. 4A) applied to input terminals $T_1$, $T_1'$ and $T_2$, $T_2'$ of the synchronous detector 7 is in phase synchronism with the carrier for detection, the video signal of a polarity as shown in FIG. 4B is produced at an emitter of a transistor $Q_{13}$ forming a buffer amplifier, and this signal is applied to an emitter of a PNP transistor $Q_{14}$ through a resistor $R_{16}$. A bias voltage $V_1$ shown in FIG. 4B is applied to a base of the transistor $Q_{14}$ by resistors $R_{18}$ and $R_{19}$ while a load resistor $R_{17}$ is connected to its collector. As described above, when the phase-locked loop is in synchronism, the base-emitter of the transistor $Q_{14}$ is reverse biased so that the transistor $Q_{14}$ remains cut off. Therefore, no sweep signal is produced. Under this condition, the transistor $Q_{14}$ functions to eliminate the white noise. When the video signal includes the white noise beyond white which is sufficient to render the PNP transistor $Q_{14}$ conductive, the emitter of the transistor $Q_{14}$ serves as a constant voltage source so that the white noise is effectively eliminated. On the other hand, when the two signals applied to the input terminals $T_1$, $T_1'$ and $T_2$, $T_2'$ of the synchronous detector 7 are not in phase synchronism, the doubly balanced differential amplifier operates as a mere multiplier so that a beat component is produced at the output thereof. The beat component produced at the emitter of the transistor $Q_{13}$ shows a waveform as shown in FIG. 4B' having a zero carrier level 1 as a mean DC level and an envelope which includes a relatively low frequency component of the video signal. The beat component detected by the transistor $Q_{14}$ and applied to the base of the transistor $Q_{15}$ is converted at the emitter of the transistor $Q_{15}$ or at the terminal $T_3$ to an approximate sawtooth wave as shown in FIG. 4C' by properly selecting the charge/discharge time constant of a capacitor $C_1$ and a resistor $R_{20}$. While the waveform is shown in FIG. 4 at the horizontal scanning frequency for the simplification of explanation, similarly an approximate sawtooth wave signal at the vertical scanning frequency can be obtained as well. On the other hand, a PNP transistor $Q_{16}$ having its base connected to the emitter of the transistor $Q_{15}$ is supplied with a bias voltage $V_1$ as shown in FIG. 4C' at emitter thereof, by resistors $R_{21}$ and $R_{22}$. Thus, the transistor $Q_{16}$ is cut off near the peak of the sawtooth wave signal so that a transistor $Q_{17}$ conducts only during the scanning period. The conduction of the transistor $Q_{17}$ assures that the capacitor $C_1$ is charged only during the presence of the synchronizing signal. Accordingly, even when the mean luminance level of the video information is low, the sawtooth wave sweep voltage having a predetermined amplitude can be produced. This sweep voltage is combined with the output of the low pass filter 9 in the phase-locked loop and the combined signal is applied to the VCO 3 to change the operating frequency thereof.

FIG. 6 shows the detail of a portion of the arrangement shown by a broken line in FIG. 2. In this arrangement, when the first phase-locked loop is in out-of-synchronization condition, the detector 8 receives the beat signal to supply positive pulses at the beat frequency to the transistor $Q_{18}$. These positive pulses charge the capacitor $C_3$ at a charging time constant determined by a resistor $R_{24}$ and a capacitor $C_3$. A charge level detector 13 closes a switch $SW_1$ when the charge on the capacitor $C_3$ reaches a predetermined charge level to establish a discharging loop by a resistor $R_{25}$, and opens the switch $SW_1$ when the charge on the capacitor $C_3$ reaches a predetermined discharge level to initiate the charging by the transistor $Q_{18}$. This arrangement can also produce the sweep voltage.

As described hereinabove, the present invention can expand the pull-in range of the phase control circuit to a great extent. Furthermore, since the sweep voltage for forced sweep is produced by the sweep voltage generator circuit having the detection polarity which is opposite to the demodulating polarity of the synchronous demodulator, the phase synchronism or the out-of-phase synchronism can be detected by the directly-coupled circuit. Therefore, the entire circuit configuration can be of directly coupled type so that an arrangement which is suited for use in integrated circuit structure can be provided.

The present invention should not be limited to the arrangement shown in FIGS. 1 and 2. For example, the arrangement shown in FIG. 5 in which a reference oscillator 3' for supplying the carrier to the phase shifter 6 and the phase comparator 4 operates at a fixed frequency, and the output of the adder 11 is supplied to the local oscillator comprising the voltage-controlled oscillator of the tuner 1 can attain a similar effect to that of FIG. 1. Further, although not shown in the drawing, a muting signal or synch. or non-synch. indication signal can be readily obtained from the output of the envelope detector arranged in accordance with the present invention, and such modification falls within the scope of the present invention.

Although the present invention can be applicable to many types of demodulator, the biggest practical advantage is attained when the present invention is applied to the receiving and detecting stages of the television receiver. The present invention can attain common advantages when the arrangement as shown in the drawings is used singly or in combination. In the light of the above, the arrangement of the receiving and detecting stages of the television receiver embodying the present invention has been shown in the drawings and described in the specification.

What we claim is:

1. A phase synchronizing arrangement for a television receiver including a tuner having a local signal oscillator and a mixer for receiving a radio frequency carrier signal modulated with a video signal and an audio signal to convert it to an intermediate frequency (IF) carrier signal, and an IF carrier signal phase synchronizing circuit, said phase synchronizing circuit comprising:

first phase-locked loop (PLL) means comprising a phase comparison means for producing an error signal which is proportional to a phase difference between said converted intermediate frequency carrier signal and an output signal from an IF carrier generator; and a voltage-controlled oscillator functioning as the IF carrier generator in response to the error signal from said phase comparison means, and second phase-locked loop means comprising a video synchronous detection means for detecting the converted intermediate frequency carrier signal using an output of the IF carrier generator to derive a video signal therefrom; an envelope detection means having an input DC-coupled to an output terminal of said video synchronous detection means for detecting an output signal thereof when said first phase-locked loop means is in a non-phase-synchronized condition; and, a sweep signal generating means responsive to the output signal detected by said envelope detection means for generating a sweep signal, said voltage-controlled oscillator being controlled by said sweep signal from said sweep signal generating means.

2. A phase synchronizing arrangement for a televison receiver according to claim 1 wherein said sweep signal generating means of the second phase-locked loop means includes a low-pass filter coupled to said envelope detection means for extracting low frequency components of the video signal to generate said sweep signal, and a synchronous signal separator coupled between said low-pass filter and said envelope detector means for deriving a synchronous signal from an output from said envelope detection means and for controlling the operation of said envelope detection means with the derived synchronous signal.

3. A phase synchronizing arrangement for a television receiver according to claim 1 wherein said sweep signal generating means of the second phase-locked loop means includes;

a low-pass filter having an input thereof coupled to an output of said envelope detection means; and a sweep voltage generator controlled by an output signal of said low-pass filter to generate a sweep voltage and having an output thereof coupled to said voltage-controlled oscillator.

4. A phase synchronizing arrangement for a television receiver according to claim 1 wherein said sweep signal generating means of the second phase-locked-loop means includes a sweep voltage generator having a capacitor which is charged by an output signal of said envelope detector means and a detector for detecting an amount of charge on said capacitor for initiating the discharge through a discharge circuit when the charge on said capacitor reaches a predetermined amount, the output of said sweep voltage generation means being coupled to said voltage-controlled oscillator.

5. A phase synchronizing arrangement for a television receiver according to claim 1 wherein said video synchronous detection means has a predetermined output impedance, and said envelope detection means has an input impedance which is much lower than the output impedance of said video synchronous detection means, whereby said envelope detection means functions as a white noise clipper for the video signal derived from said video synchronous detection means under the phase-synchronized condition of said first phase-locked loop means.

6. A phase synchronizing arrangement for a television receiver according to claim 2 wherein said low-pass filter includes a transistor having an emitter to which a parallel circuit of a capacitor and a resistor is connected, the charge and discharge time constant of said capacitor and said resistor being determined to produce a sawtooth wave signal as said sweep signal.

7. A phase synchronizing arrangement for a television receiver according to claim 5 wherein said envelope detection means includes a transistor having an emitter thereof coupled to the output of said video synchronous detection means, a base thereof adapted to be supplied with a bias voltage to render said transistor conductive only when said first phase-locked loop means is out of synchronization, and a collector thereof connected to a load resistor.

8. A phase synchronizing arrangement for a television receiver according to claim 1 wherein said voltage-controlled oscillator receives the error signal from said phase comparison means through a DC-coupling and an output signal of said second phase-locked loop means through an AC-coupling.

9. A phase synchronizing arrangement for a television receiver including a tuner having a local signal oscillator and a mixer for receiving a radio frequency carrier signal modulated with a video signal and an audio signal to convert it to an intermediate frequency (IF) carrier signal, and a local signal oscillator phase synchronizing circuit, said phase synchronizing circuit comprising:

first phase-locked loop (PLL) means comprising a phase comparison means for producing an error signal which is proportional to a phase difference between said converted intermediate frequency carrier signal and an output signal from an IF carrier generator; and a voltage-controlled oscillator functioning as a local signal oscillator in response to the error signal from said phase comparison means, and, second phase-locked loop means comprising a video synchronous detection means for detecting the converted intermediate frequency carrier signal using an output of the IF carrier generator to derive a video signal therefrom; an envelope detection means having an input DC-coupled to an output terminal of said video synchronous detection means for detecting an output signal thereof when said first phase-locked loop means is in a non-phase-synchronized condition; and, a sweep signal generating means responsive to the output signal detected by said envelope detection means for generating a sweep signal, said voltage-controlled oscillator being controlled by said sweep signal from said sweep signal generating means.

10. A phase synchronizing arrangement for a television receiver according to claim 9 wherein said sweep signal generating means of the second phase-locked loop means includes a low-pass filter coupled to said envelope detection means for extracting low frequency components of the video signal to generate said sweep signal, and a synchronous signal separator coupled between said low-pass filter and said envelope detector means for deriving a synchronous signal from an output from said envelope detection means and for controlling the operation of said envelope detection means with the synchronous signal.

11. A phase synchronizing arrangement for a television receiver according to claim 9 wherein said sweep signal generating means of the second phase-locked loop means includes;
   a low-pass filter having an input thereof coupled to an output of said envelope detection means; and
   a sweep voltage generator controlled by an output signal of said low-pass filter to generate a sweep voltage and having an output thereof coupled to said voltage-controlled oscillator.

12. A phase synchronizing arrangement for a television receiver according to claim 9 wherein said sweep signal generating means of the second phase-locked-loop means includes a sweep voltage generator having a capacitor which is charged by an output signal of said envelope detector means and a detector for detecting an amount of charge on said capacitor for initiating the discharge through a discharge circuit when the charge on said capacitor reaches a predetermined amount, the output of said sweep voltage generation means being coupled to said voltage-controlled oscillator.

13. A phase synchronizing arrangement for a television receiver according to claim 9 wherein said video synchronous detection means has a predetermined output impedance, and said envelope detection means has an input impedance which is much lower than the output impedance of said video synchronous detection means, whereby said envelope detection means functions as a white noise clipper for the video signal derived from said video snchronous detection means under the phase-synchronized condition of said first phase-locked loop means.

14. A phase synchronizing arrangement for a television receiver according to claim 10 wherein said low-pass filter includes a transistor having an emitter to which a parallel circuit of a capacitor and a resistor is connected, the charge and discharge time constant of said capacitor and said resistor being determined to produce a sawtooth wave signal as said sweep signal.

15. A phase synchronizing arrangement for a television receiver according to claim 13 wherein said envelope detection means includes a transistor having an emitter thereof coupled to the output of said video synchronous detection means, a base thereof adapted to the supplied with a bias voltage to render said transistor conductive only when said first phase-locked loop means is out of synchronization, and a collector thereof connected to a load resistor.

16. A phase synchronizing arrangement for a television receiver according to claim 9 wherein said voltage-controlled oscillator receives the error signal from said phase comparison means through DC-coupling and an output signal of said second phase-locked loop means through AC-coupling.

* * * * *